United States Patent [19]
Noto

[11] Patent Number: 4,568,961
[45] Date of Patent: Feb. 4, 1986

[54] VARIABLE GEOMETRY AUTOMATED UNIVERSAL ARRAY

[75] Inventor: Richard Noto, Maple Shade, N.J.

[73] Assignee: RCA Corporation, Princeton, N.J.

[21] Appl. No.: 474,511

[22] Filed: Mar. 11, 1983

[51] Int. Cl.[4] ............................................. H01L 27/10
[52] U.S. Cl. ........................................ 357/45; 357/40; 357/68
[58] Field of Search .............................. 357/40, 45, 68

[56] References Cited
FOREIGN PATENT DOCUMENTS

73641A2  9/1983  European Pat. Off. .
2104284A  3/1983  United Kingdom .

OTHER PUBLICATIONS

"Automated Design Procedures for VLSI" DELET--TR-78-2960-1, Jun. 1979, ERADCOM.
"Automated Design Procedures for VLSI", DELET--TR-78-2960-2, Feb. 1980, ERADCOM.
"Automated Design Procedures for VLSI", DELET--TR-78-2960-3, Jun. 1980, ERADCOM.
"Automated Design Procedures for VLSI", DELET--TR-78-2960-F, Mar. 1981, ERADCOM.

Primary Examiner—Andrew J. James
Assistant Examiner—Mark Prenty
Attorney, Agent, or Firm—Joseph S. Tripoli; Robert L. Troike; Robert Ochis

[57] ABSTRACT

A universal array of the type designed for automatic computer aided design of its customizing conductive layer is easily scaled to change the number of devices in the array. The array comprises an inner region having first direction extending rows of originally uncommitted device cells. Each row of cells is powered from first direction extending row power buses. These rows of cells are spaced apart in a second, perpendicular, direction by interleaved first type wiring corridors. The inner region is surrounded by an outer region including second type wiring corridors and peripheral cells. The second type wiring corridors space at least some peripheral cells from the inner region. The second type corridors include second-direction-extending inner-region-supplying power buses which connect to cell row power buses and wiring roadways spaced from the inner region by the inner buses. The wiring roadways are free of row power buses. The second type corridors are populated with tunnels which extend in the first direction only and underlie the roadways.

4 Claims, 4 Drawing Figures

VARIABLE GEOMETRY AUTOMATED UNIVERSAL ARRAY

This invention relates to the field of integrated semiconductor circuits. More particularly it relates to universal arrays of semiconductor devices disposed on a common substrate and suitable for electrical connection into a wide variety of circuits by a final customizing conductive layer.

Many custom integrated circuits now require hundreds or thousands of logic gates to implement their intended logic functions. The cost of laying out custom circuits for such designs is substantial and can make them prohibitively expensive. To be cost effective, large production quantities of the custom integrated circuit would be required or high prices for small quantities would be necessary.

A universal array is a more economical alternative for smaller quantities of a custom circuit. A universal array includes a large number of originally uncommitted semiconductor devices on a common substrate or semiconductor chip. The chip is designed to allow customizing circuit paths of a final, custom, patterned conductive layer to electrically interconnect the uncommitted devices into elements (such as standard logic elements) and those elements into a desired circuit (so as to implement, for example, a desired logic function). In this way, the design costs of the basic array may be spread over many different custom circuits. This combines a number of relatively low volume circuits into effectively a high volume circuit to achieve many of the economies of high volume circuits. It is preferred that the achievable logic circuits be limited only by the number and types of devices included in the array. Some universal arrays are designed to be electrically interconnected into a custom circuit using a single customizing conductive layer. Others are designed to utilize more than one customizing layer.

As the size and complexity of logic circuits to be implemented by universal arrays has increased, computer aided design techniques have been developed. These include computer programs (software) for automatically selecting and routing circuit paths. When these circuit paths electrically interconnect the devices in the actual array, the basic universal array is made into the desired custom logic circuit. Software is also used to generate data for the automatic fabrication of a photomask to produce the circuit paths in the metallization pattern of the customizing layer.

One array designed for automatic (computer generated) layout of its single customzing metallization layer is known as the automated universal array (AUA). This array was developed under an U.S. Army Electronics Research and Development Command (ERADCOM) contract. This array is the subject of four contract reports entitled, "AUTOMATED DESIGN PROCEDURES FOR VLSI" having contract report numbers DELET-TR-78-2960-1 through DELET-TR-78-2960-3 and DELET-TR-78-2960-F dated June 1979, February 1980, June 1980 and March 1981, respectively. Each of these reports is incorporated herein by reference. The AUA is also the subject of a patent application entitled, "AUTOMATED UNIVERSAL ARRAY" by Richard Noto and Fred Borgini which is assigned to the U.S. Government.

The AUA includes 640 internal gates or cells on a semiconductor chip with dimensions of 208 mils×208 mils (0.528 cm×0.528 cm). The design of this chip in combination with its automatic metallization-layout computer-aided-design software allows automatic design of the final customizing metallization. This system is effective even for circuits utilizing up to at least 90% of the 640 cells present in the array. This automatic layout speeds array customization and minimizes semiconductor and logic circuit cost.

The layout of this array and the associated customization software establish defined relationships among various portions of the chip. Because of these relationships, any changes in the number of cells in the array requires detailed redesign of the array and involves interrelated adjustments among different portions of the array. This in turn requires rewriting of the routing generation software.

Thus, it would be desirable to have an integrated circuit array of elements, such as the automated universal array, which can be readily scaled to change the number of cells included in the array without either detailed redesign of the array or its routing software.

In accordance with one embodiment of the present invention there is provided an improved universal array of the type including a substrate which has an inner region and an outer region, and a plurality of circuit components thereon. The circuit components are originally adapted for interconnection into a desired electrical circuit by customizing circuit paths of a patterned conductive layer. The inner region includes (1) a plurality of cells each including some of the circuit components, the cells being disposed in a plurality of rows extending in a first direction, (2) a plurality of first type wiring corridors interleaved with and spacing apart the cell rows in a second, perpendicular direction, and (3) cell row power bus pathways extending in the first direction along each cell row and each crossing at least one second-direction-extending border of the inner region. The outer region includes (1) at least one second type wiring corridor, each second type wiring corridor disposed adjacent a second direction extending border of the inner region, (2) a plurality of peripheral cells each including some of the circuit components, each peripheral cell of this plurality being spaced from the inner region in the first direction by a second wiring corridor and (3) a second-direction-extending pathway for a power bus for connection to peripheral cells. The improvement in accordance with this embodiment involves a configuration of the second type wiring corridors and the power bus pathways which, during attempts to scale the array, effectively decouples the details of the inner region configuration from the details of the outer region configuration. An improved second type wiring corridor includes (1) first direction extending tunnels only, (2) a second direction extending wiring roadway overlying the first direction extending tunnels, this roadway being free of pathways for cell row power buses, (3) a pathway for a second-direction-extending inner-region-supplying power bus, this inner bus pathway intersecting row power bus pathways and being spaced from the peripheral bus pathway by the second direction extending roadway, and (4) tunnel portions extending from one side of the inner bus pathway to the other side of that pathway and each having a contact on the cell row side of the inner bus pathway and a contact on the roadway side of that bus pathway.

BRIEF DESCRIPTION OF THE DRAWINGS

The basic topographical characteristics of a prior art automated universal array 10 are illustrated in the plan view of FIG. 1. FIG. 2 is a more detailed plan view of a portion of this array. The array 10 is the array described in the above mentioned reports on "AUTOMATED DESIGN PROCEDURES FOR VLSI". Array 10 has a substrate 11 having a central or inner region 12 and an outer region 14 which abut along the dashed line 13. The inner region 12 includes a plurality of identical basic device cells 16. Each of the cells 16 includes several semiconductor devices (not shown). The cells 16 are disposed in ten rows 15 of sixty-four cells each. The rows 15 extend in a first direction (horizontal in the drawings). The basic device cells 16 have contact pins 18 (FIG. 2) for connection to an overlying customizing metallization pattern 100. A few circuit paths (102, 104, 106 and 108) of an illustrative custom metallization pattern 100 are illustrated in FIG. 2.

Figure 1:
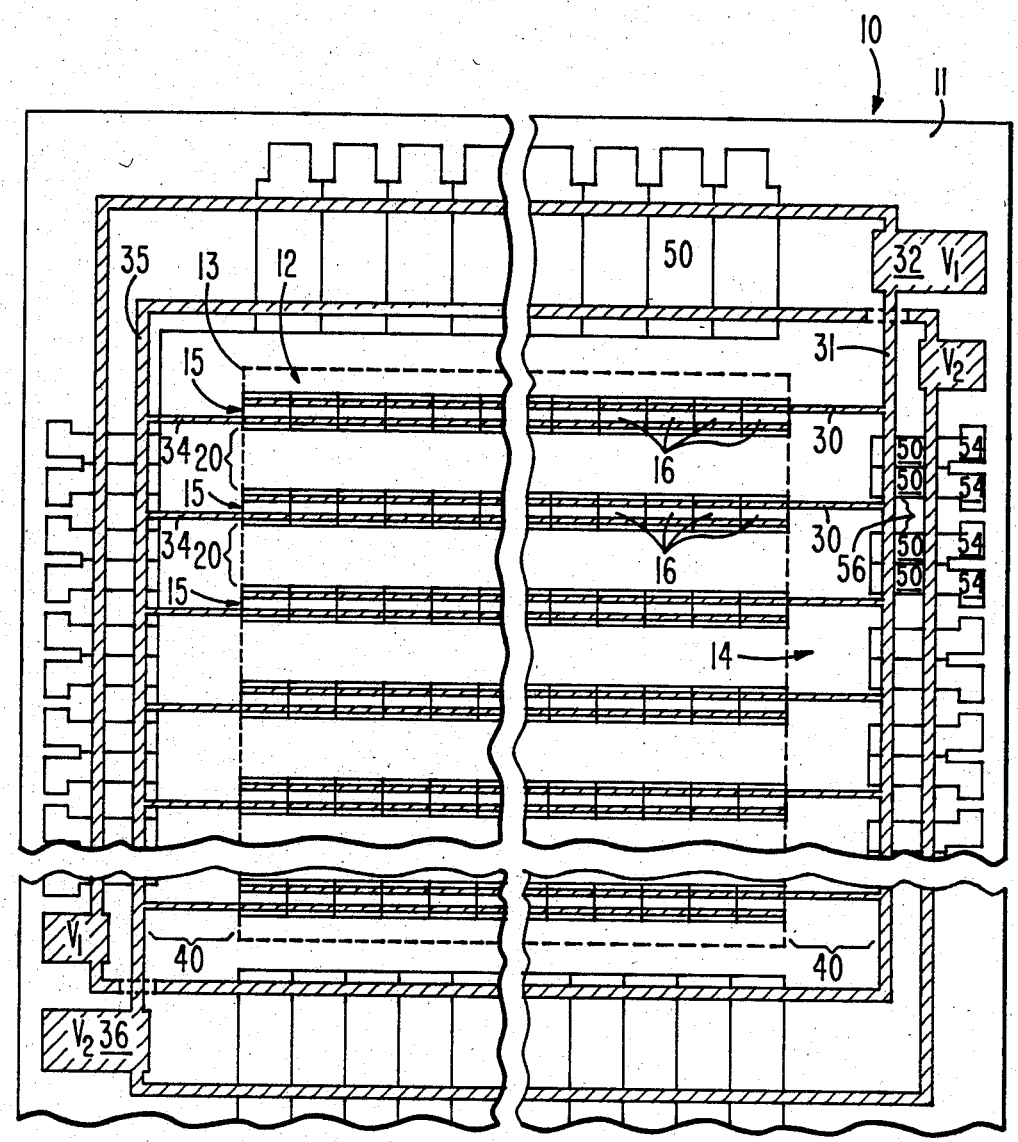
FIG. 1 is a plan view of a portion of a prior art automated universal array.

Within the inner region 12 a plurality of inner wiring corridors 20 are interleaved with and space apart the rows 15 in a second (vertical) direction. Each wiring corridor 20 which is between two cell rows 15 (for example rows 15a and 15b in FIG. 2) includes five ranks 21 of fixed, vertically extending, conductive tunnels 22 which have contacts 24. Each of the tunnel ranks 21 includes a plurality of parallel tunnels which extend vertically in the drawings. The tunnels in adjacent ranks 21 are aligned with each other (see for example tunnels 22a, 22b and 22c in FIG. 2). The wiring corridors above the upper-most cell row 15 and below the lower-most cell row 15 in FIG. 1 each contain only three tunnel ranks. Each tunnel in the array 10 has polysilicon as its conductive material and has two contacts, one at each of its ends. The contacts of the tunnels are the only portions of the tunnels which are conductively accessible to the customizing metallization 100. Each of the tunnels 22 is electrically isolated from all of the other tunnels prior to the addition of the final, customizing metallization 100. A first direction extending (horizontal in the drawings) roadway 23 overlies the tunnels 22 of each rank 21. Each roadway 23 includes space for three horizontally extending inner region conductors 112 (see for example conductors 112a, 112b and 112c in FIG. 2) of the customizing metallization pattern 100. These wiring lanes are insulated from the underlying tunnels by a layer of insulating material. A conductor 112 only connects to a given underlying tunnel if its conductive material couples to one of the contacts of that tunnel. Conductor 112a and tunnel 22g are coupled in this way.

Figure 2:
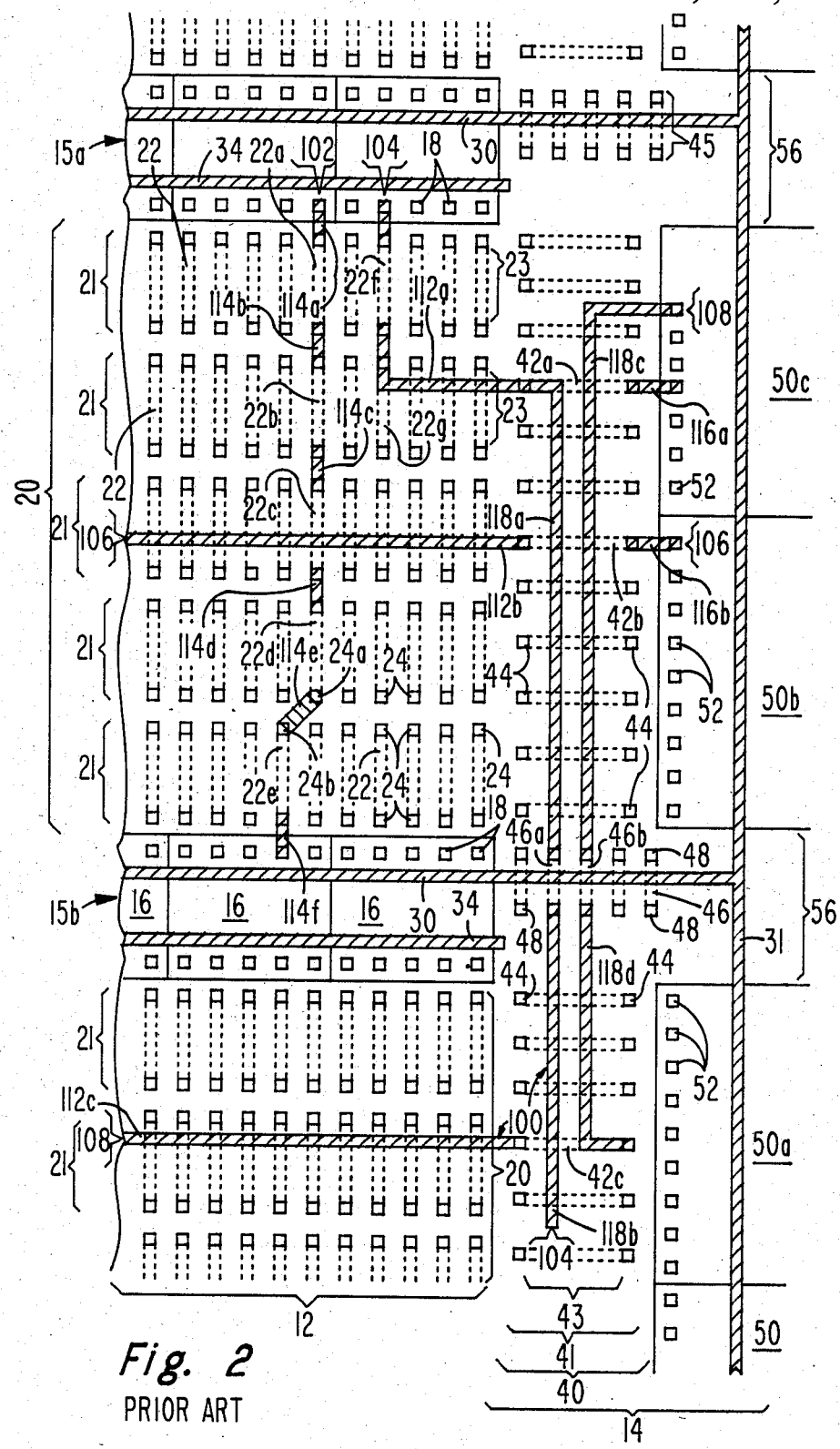
FIG. 2 is a more detail plan view of a portion of the prior art array of FIG. 1.

Each of the exemplary circuit paths 102, 104, 106 and 108 of layer 100 involves a series connection of fixed tunnels and custom metallization conductors. The tunnels 22 enable row-to-row (vertical in the drawings) routing of connections to and among cells 16. In FIG. 2, the vertical path 102 comprises vertical conductors 114a, 114b, 114c, 114d, 114e and 114f and vertical tunnels 22a, 22b, 22c, 22d and 22e. The horizontal conductors such as 112a, 112b and 112c enable interconnection of laterally displaced cells in the same or different rows. The tunnels of adjacent ranks are spaced far enough apart in the vertical direction to allow a conductor (114e) to connect a contact (24a) of a tunnel (22d) in one rank to the adjacent contact (24b) of a diagonally adjacent tunnel (22e) in the next rank. The tunnel/custom conductor combination enables horizontal and vertical conductors to be isolated from each other except at desired interconnection points. This makes customization by a single conductive layer possible. The layer 100 which forms the customizing conductors interconnects appropriate tunnels and connects to appropriate cell pins 18 as by conductors 114a and 114f, provides the power buses 30, 31, 34 and 35 and customizes the cells 16 into desired types of logic elements. However, no cell-customizing conductor segments are shown in the drawings.

Single layer customization of a universal array is preferred over the use of multiple customizing layers for several reasons. First, the arrays can be fabricated through the completion of the metallization deposition and then stored until needed. When a chip is needed, the metallization is patterned in accordance with a customizing mask and selectively removed to leave the desired customizing conductive pattern. Second, the customizing is less expensive because only one custom mask is needed for a given circuit. Third, the single custom layer process is less complicated and more reliable than multiple custom layer processes. Fourth, this array is structured to make a single custom layer sufficient.

The outer region 14 of substrate 11 includes side wiring corridors 40 and peripheral circuits or cells 50. The peripheral cells substantially surround the inner region 12 and provide interfaces to off-chip circuitry. Peripheral cells along the lateral (vertical in the drawings) edges of the chip are spaced from the inner region 12 by the side wiring corridors 40. A portion of the array which includes a portion of a side wiring corridor is illustrated in greater detail in FIG. 2.

Each of the peripheral cells is a standard cell having a predefined structure which includes contact pins 52 in defined locations within the cell structure. Not all of the cells 50 are the same. However, each type has a fixed semiconductor structure which is capable of being customized to provide the functions that cell type is designed to be able to provide. The cells 50 are customized by the conductive layer 100 at the same time as the rest of the array.

Overlying the right hand peripheral cells and running in a vertical orientation is a $V_1$ power supply bus 31. The vertical $V_1$ bus 31 connects to a contact pad 32 for wire or other bonding to an external terminal to which a source of the voltage $V_1$ may be connected. Each cell row 15 has thereover a different, horizontally extending, $V_1$ row power supply bus 30. Each of the row power buses 30 connects to the vertical bus 31 at a point in horizontal alignment with its associated cell row. The vertical bus 31 carries power from the pad 32 to the circuits in the cell rows and to the peripheral circuits which underlie bus 31.

The inner region cells generally draw very low currents. This is especially true when they are constructed in silicon on sapphire using CMOS circuits. The peripheral circuits usually draw substantially more current than the inner region cells. The relatively heavy current drawn by peripheral cells can cause significant voltage differences among cell rows as a result of the voltage drops these currents induce along the bus 31. These voltage differences can adversely affect the operation of arrays which, due to fabrication tolerances have inner regions whose operation is sensitive to these voltage differences.

A vertically extending, $V_2$ power supply bus 35 (similar to bus 31) overlies the left hand peripheral cells and connects to an external contact pad 36 for connection to an external source of the $V_2$ voltage. Each row of cells is overlain by a different, horizontally extending, $V_2$ row power supply bus 34. Each row bus 34 connects to vertical bus 35 at a point in horizontal alignment with its associated cell row. Bus 35 is subject to the same current drain and voltage drop problems as bus 31.

The semiconductor device circuit within each cell 16 of a given row 15 is connected between that row's $V_1$ and $V_2$ power supply buses 30 and 34. The specific value of the voltages $V_1$ and $V_2$ are determined by the type of circuitry utilized within the array 10. The cells are designed to be customized (by layer 100) individually or in groups to form desired basic logic circuits. The details of the cell 16 structure, although important to the array operation, are not necessary to an understanding of the present invention and therefore are omitted. They are described in the aforementioned reports.

Within side wiring corridors 40 are sets of horizontally extending tunnels 42. Each set of tunnels 42 contains fifteen tunnels and is disposed in horizontal alignment with one of the inner wiring corridors 20. Each tunnel 42 extends from the vicinity of the lateral end of the aligned wiring corridor 20 to the vicinity of the inner edge of the aligned peripheral cell 50. Each of tunnels 42 has two contacts 44, one at each of its ends. Horizontal tunnels 42 identified as 42a, 42b and 42c are shown connected as parts of custom conductive circuit paths 104, 106 and 108, respectively. The tunnels 42 have lengths which provide space thereover for a vertically running roadway 43 having space for four vertically running metallization lanes. Each metallization lane can be occupied by a vertical customizing conductor 118 which is isolated from the conductors (if any) in the other lanes.

In FIG. 2 custom conductors such as 118a, 118b, 118c and 118d are located in the side wiring corridor.

In extending from the vertical power supply bus 31 (or 35) into the cell row, each horizontal $V_1$ (or $V_2$) (row) supply bus 30 (or 34) extends across the righthand (or left-hand) side wiring corridor. This blocks the lanes of the side roadway 43 for custom circuit paths in metallization layer 100. To enable routing of vertical customizing side corridor conductors across the row power buses, a rank 45 of vertically extending conductive tunnels 46 extends under each of these $V_1$ (or $V_2$) row power supply buses. Vertical tunnels 46 identified as 46a and 46b are shown connected as part of custom circuit paths 104 and 108, respectively.

Each of the pre-defined peripheral cells 50 has a set of contact pins 52 and an external contact pad 54 (not shown in FIG. 2). Contact pins 52 are disposed along the inner border of the peripheral cells. Contact pads 54 are disposed along the outer border of the chip for connection to external leads—as by wire bonding or other techniques. Each horizontally extending cell row power bus 30 (or 34) in connecting to its vertical bus 31 (or 35) crosses an imaginary line connecting the pins 52 of the peripheral cells 50 which are overlain by the vertical bus (31 or 35). To ensure proper operation of the final circuit, contact between row power buses (30 and 34) and pins 52 must be avoided. In order to interconnect the inner region cells 16 and the peripheral cells 50 into a desired circuit there must be sufficient space adjacent to each peripheral pin 52 to allow the customizing layer 100 to connect to that pin 52, as necessary, without shorting to other pins, being blocked by or blocking other needed circuit paths.

The vertical tunnels 46 within side corridor 40 and the contacts 48 of these tunnels block routing of customizing circuit paths to peripheral cell pins 52 in horizontal alignment with these vertical tunnels. Consequently, in order to maintain routeability at each row bus 30 or 34 a no-man's land 56 having a substantial vertical extent must be kept free of pins 52. Because of the predefined nature of the cells 50, the cells 50 must be excluded from these no-man's land regions 56. This establishes a direct interrelation between the row power bus (or cell row) location and the allowable locations for the peripheral cells. This interrelation in combination with the size of the peripheral cells and the center-to-center spacing of cell rows limits to two the number of peripheral cells between adjacent cell rows along a lateral edge of the chip. These restrictions are topograpghical and not directly related to the internal semiconductor structure of the peripheral cells.

The final, customizing metallization layer constitutes the conductive material of the power buses, the conductors overlying tunnels, the conductors interconnecting tunnels, the conductors connecting to cells and the conductors customizing cells. All of these conductors are formed as part of the single metallization layer 100. The polysilicon tunnels require a greater width (12 microns) than the metal conductors, (10 microns). The horizontal grid on this array is in units of 12 microns and the vertical grid is in units of 10 microns. The vertical center-to-center spacing of adjacent horizontal conductors in the central area is 10 microns and the vertical center-to-center spacing of adjacent horizontally extending tunnels 42 in the side wiring corridor is 20 microns. This difference in conductor width and spacing combined with the interrelation between the cell rows 15 and the peripheral circuitry 50 create a strict, defined relationship among the number of peripheral cells, the number of rows of interior cells 16, the vertical height of the inner wiring corridors 20 and the vertical height of the cell rows. These defined relationships have been found to render attempts at modification of this array to include more rows of cells or rows of cells having different spacings tedious. Such expansion is limited to increases in the number of cell rows in increments of two. Such expansion also requires custom restructuring of the computer-aided-design routing software for each such new structure of the semiconductor array. This severly limits the economical adaptability of the array 10 to increasingly complicated circuits.

Figure 3:
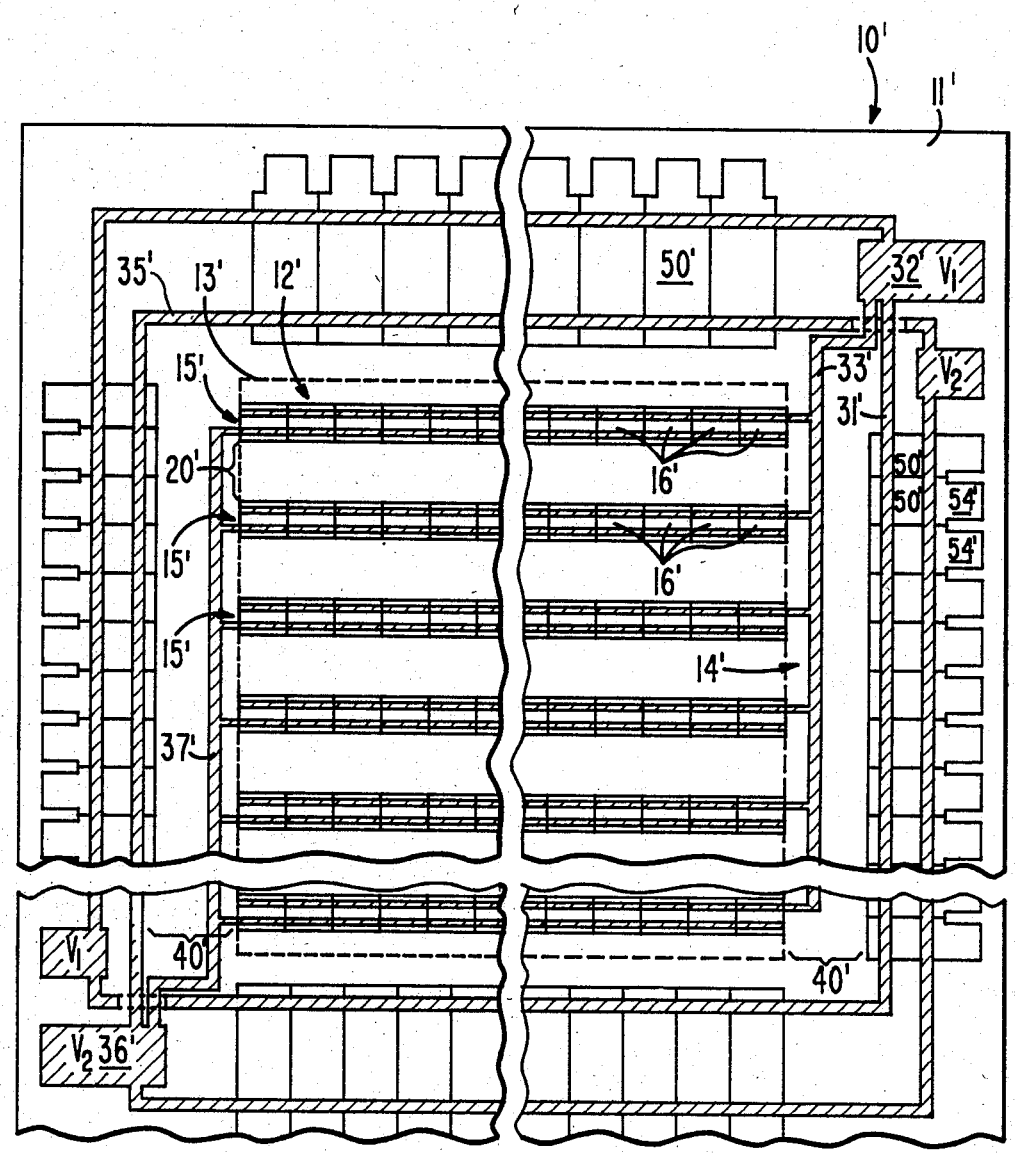
FIG. 3 is a plan view of a portion of an automated universal array in accordance with the present invention.
Figure 4:
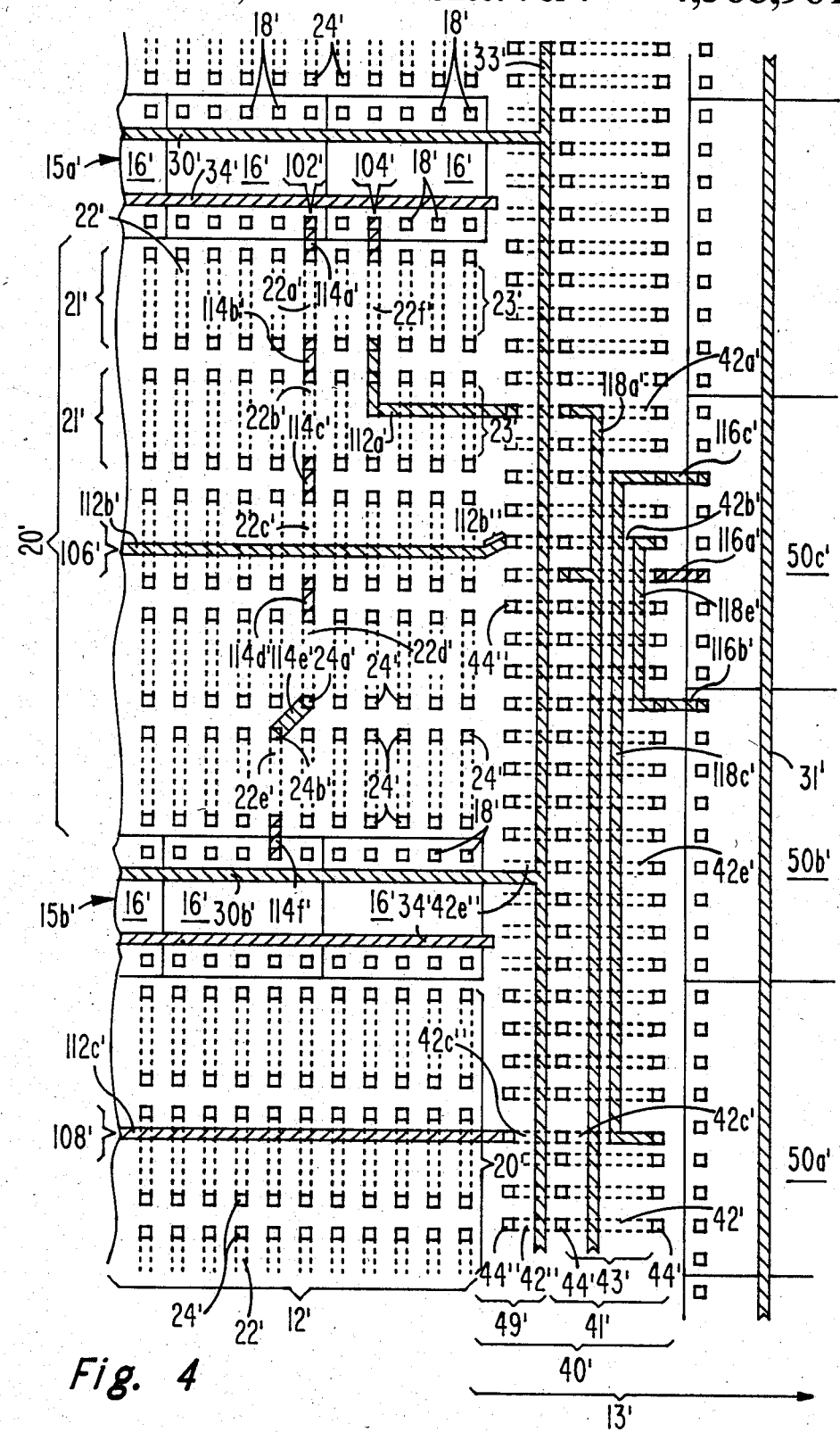
FIG. 4 is a more detailed plan view of a portion of the array of FIG. 3.

FIG. 3 is a plan view illustration of a universal array 10' in accordance with the present invention. The array 10' may be fabricated in bulk semiconductor material such as bulk silicon or in semiconductor material disposed on an insulating substrate such as silicon on sapphire. FIG. 4 is a detail of the array 10' similar to the FIG. 2 detail of the array 10. The array 10' has many features which are similar to corresponding features of the array 10, but differs therefrom in a number of particulars, in accordance with the present invention. Corresponding features in the two arrays are identified by the same reference numeral. The features of array 10' have a prime (') included in their reference numerals to distinguish them from similar features of array 10. The inner regions 12 and 12' of the arrays 10 and 10' may be identical or inner region 12' may differ substantially in ways which are mentioned subsequently. The changes from array 10 to array 10' which are important to scalability are in the outer region 14' of array 10'. These changes, however, also make feasible many changes in the inner region 12'. The same exemplary custom circuit paths 102', 104', 106' and 108' are illustrated for array 10' in FIG. 4 as were illustrated for array 10 in FIG. 2. However, the details of the portions of the paths 104', 106' and 108' which are in the outer region 14' are different in FIG. 4 than in FIG. 2. This is a result of the restructuring of the outer region of the array in accordance with the invention. For illustrative purposes the portion of each of these paths which is within inner region 12' of FIG. 4 has been kept the same as inner region 12 of FIG. 2.

In the array 10' the vertical power buses 31' and 35' serve as peripheral cell power buses only. New central region vertical power buses 33' ($V_1$) and 37' ($V_2$) are positioned within transition portions 49' of the side wiring corridors 40' which are adjacent the lateral ends of the cell rows 15'. These buses do not overlie either the peripheral cells 50' or inner region cells 16'. Bus 33' connects directly to pad 32' and bus 37' connects directly to pad 36'. This minimizes the cell row to cell row voltage variations within the central region since the central region buses are isolated from the peripheral buses except at the pads 32 and 36. This can increase the yield of fully functional devices for a given set of fabrication tolerances as compared to the array 10.

A vertically extending side wiring roadway 43' is positioned between the pathway for the vertical inner region power bus (33' or 37') and the horizontally adjacent peripheral cells. Because of this positioning of the vertical inner region buses, the row power buses 30' and 34' do not cross the side roadways 43'. Thus, the wiring lanes of these roadways are not blocked by the row power buses and there is no need for vertical tunnels in the side wiring corridor 40' of array 10'. This makes the side roadways 43' similar to the inner roadways 23 or 23' in that each wiring lane extends the full length of its wiring corridor without any obstructions in the form of fixed conductors which are part of the metallization layer 100. Each side wiring corridor 40' is populated with a continuous rank 41' of uniformly spaced horizontally extending tunnels 42' which are spaced vertically on 12 micron centers. This rank 41' of horizontal tunnels encompasses the full height of the side corridor 40'. This is in direct contrast to the prior art array 10 in which the side wiring corridors contain interleaved sets of vertical tunnels (46) and horizontal tunnels (42). As a consequence, in array 10' the vertical custom conductor 118a' in side roadway 43' replaces the array 10 combination of custom conductor 118a, tunnel 46a and custom conductor 118b. Similarly, custom conductor 118c' of array 10' replaces the array 10 combination of custom conductor 118c, tunnel 46b and custom conductor 118d. To maximize array scalability a given array may be designed with from one to nine or more aligned tunnel ranks 41' in the side wiring corridor 40'. Each of these ranks may have from two to nine wiring lanes disposed over it.

Each of the horizontal tunnels 42' includes a portion 42" which extends from the inner region side of the inner bus pathway 33' (or 37') to the peripheral cell side of that pathway. In this embodiment the inner bus pathway portion of each tunnel 42" is continuous with the main portion of its tunnel 42'. These portions together form an extended tunnel. Most of the extended tunnels have three contacts which are exposed for connection to the customizing layer. Those tunnels 42' which are in alignment with a cell row 15 have only two contacts each. These contacts are best seen in FIG. 4. Two of these contacts (44') are at the opposing ends of the main tunnel portion 42'. These contacts are located in the side wiring corridor between the vertically extending inner bus pathway (33' or 37'), and the peripheral cells. The first of these is located adjacent the peripheral circuitry, the second is located adjacent the inner power bus (33' or 37'). The two contacts 44' of each tunnel are spaced apart a distance which provides space for a desired number of (from two to nine or more and preferably four) vertically extending metallization lanes within the wiring roadway 43' over the tunnel. The third contact (44") of each extended tunnel 42' which has three contacts is connected to the inner bus tunnel portion 42" and is located on the inner region or cell row side of the inner power bus (33' or 37'). The region of the side wiring corridor between the ends of the cells rows and the second contacts 44' of the tunnels 42' is the transition region 49'. The portion of the extended tunnel in the transition region (between the second contact 44' and the contact 44") enables the routing of horizontal circuit paths under the inner power bus 33' or 37'. The contacts 44" are omitted in alignment with cell rows 15 because they are not needed and because their omission assures that the row power buses 30' and 34' will not make contact with an extended tunnel. If desired, each tunnel 42' could be separated into two horizontally aligned tunnels (with the second contact 44' being separated into two contacts—one to the main tunnel portion 42' and one to the power bus tunnel portion 42". However, this is not considered necessary for full routing flexibility and would unnecessarily consume valuable semiconductor surface area.

Any misalignment between an inner corridor horizontal conductor 112' and a side corridor tunnel 42' is accomodated by the customizing metallization 100 in the transition portion 49' of the side wiring corridor (for instance see conductor segment 112b" in FIG. 4).

If it is desired to increase the operating speed of the final circuit, the polysilicon fixed conductors which form the tunnels may be replaced by metal fixed conductors. The customizing metallization then becomes a second level of metallization. Only the final layer is changed to make different custom circuits.

The continuous, uninterrupted sequence of side tunnels 42' frees the structural configuration of the side wiring corridor from detailed dependence on configuration of the array inner region 12'. Since the row power buses do not extend to the peripheral cells, the locations of the row power buses place no constraints on the location of the peripheral cell contact pins. Consequently, the peripheral cells may be placed directly adjacent to each other without any predetermined positional relationship to the cells rows. This is best seen in FIG. 4.

Any change within the inner region of the chip which does not change its overall vertical extent has no effect on the number or position of side tunnels or peripheral cells. An inner region change which changes the vertical extent of the inner region affects the peripheral cells only with respect to the number which will fit along a vertical edge of the chip. Such an inner region change affects the side tunnels only by changing the number which are included, not their relative position or spacing. Because of this detail independence, the inner region 12' of array 10' may be laid out to provide an array size which is adequate to accomodate a desired complexity of circuits without concern for maintaining particular relationships with the side corridors and peripheral cells.

Thus, the present invention omits from the array 10', those structural characteristics among the inner region configuration and the outer region configuration in array 10. This makes direct scaling of the array 10' structure in accordance with anticipated circuit needs a simple procedure in which each portion is sized independently to meet those needs. This scaling can include, inter alia, changes in the number of cell rows, the height of cell rows, the length of cell rows, the number of tunnel ranks in a wiring corridor, the lengths of such tunnels and so forth. The actual chip size is determined by the portion of the chip requiring the greatest chip size to accomodate it. The other portions of the chip are sized in accordance with that overall chip size. This is in direct contrast to the detail-to-detail basis on which these features of the chip must relate in attempting to scale the array 10.

The side wiring corridors in arrays in accordance with this invention preferably include from one to nine tunnel ranks 41' each having from 2 to 9 wiring channels per roadway 43'. The inner wiring corridors 20' preferably each include from three to nine tunnel ranks 21'. Each of these tunnel ranks 21' preferably has a roadway 23' having from two to nine wiring lanes. The number of each type of tunnel ranks which are included and the number of wiring lanes for a given universal array is determined by the type of circuits it is intended to be able to provide and the resulting anticipated wiring density. This makes possible the provision of more cells (logic gates) in a given area of inner region by allowing the cell rows 15' to be placed closer together when anticipated wiring needs are small.

This independence with respect to structural details also makes the computer-aided-design software, which designs the customizing interconnections, detail independent. That software requires as input variables the locations in the array of the cell contact pins, the tunnel ends and the peripheral cell contact pins. With that and variables which define the desired logic circuit, the software can define a mask which will interconnect the cells into a desired logic circuit. No rewriting of the software for each new array size is required since array characteristics are specified as variables within the software.

The array 10' in accordance with this invention provides substantial freedom as to the number and size of cell rows and wiring corridors while still providing rapid, fully automated layout of customizing circuit interconnections.

What is claimed is:

1. An improved universal array of the type including:
   a substrate having a plurality of circuit components thereon which are originally adapted for interconnection into a desired electrical circuit by customizing circuit paths of a patterned conductive layer, said substrate having an inner region including:
   a plurality of cells each including some of said circuit components, said cells being disposed in a plurality of first direction extending rows;
   a plurality of first type wiring corridors, interleaved with and spacing apart said cell rows in a second, perpendicular direction, said wiring corridors including first direction extending wiring lanes; and
   cell row power bus pathways extending in said first direction along each cell row and each crossing at least one second-direction-extending border of said inner region;
   said substrate having an outer region including:
   a second type wiring corridor disposed adjacent said second direction extending border of said inner region;
   a plurality of peripheral cells each including some of said circuit components and spaced from said inner region in said first direction by said second wiring corridor; and
   at least one second direction extending power bus pathway for a peripheral power bus for connection to said peripheral cells; wherein the improvement comprises said second type wiring corridor including:
   a pathway for a second-direction-extending inner-region-supplying power bus, said inner pathway being spaced from said peripheral bus pathway and intersecting at least one row power bus pathway per row;
   a fixed pattern of parallel, first direction extending tunnels each having at least two contacts originally accessible to said conductive layer;
   a second direction extending roadway overlying said pattern of tunnels, said roadway being disposed between said inner bus pathway location and said peripheral cells and including space for parallel, second direction extending wiring lanes for second direction routing of the custom circuit paths of said conductive layer, each of said tunnels in said pattern having one of its contacts on either side of said roadway, said wiring lanes of said roadway being free of row power buses; and
   a plurality of power bus tunnel portions, each originally insulated from said inner bus pathway, each of said portions extending in said first direction from a contact on the cell row side of said inner bus pathway to a contact on the roadway side of that power bus pathway, each of said contacts originally accessible to said conductive layer.

2. The improved array recited in claim 1 wherein:
   said fixed pattern of tunnels included in said second type corridor extends substantially the entire second direction length of said second corridor; and
   the tunnels of said fixed pattern are uniformly spaced in said second direction.

3. The improved array recited in claim 1 wherein:
   each inner bus tunnel portion is aligned with a corresponding one of said tunnels in said pattern of tunnels to form an extended tunnel; and wherein
   each extended tunnel has three contacts originally accessible to said conductive layer, two of said contacts being on the roadway side of said inner bus pathway and one being on the inner region side of said inner bus pathway.

4. The improved array recited in claim 1 wherein:
   each of said cells includes contacts originally accessible to said conductive layer; and
   said array further comprises said patterned layer of conductive material overlying said tunnels and cells, said patterned conductive material contacting some of said tunnel contacts and some of said cell contacts to provide a custom logic circuit.

* * * * *